United States Patent [19]
Chen

[11] Patent Number: 5,681,425
[45] Date of Patent: Oct. 28, 1997

[54] TEOS PLASMA PROTECTION TECHNOLOGY

[75] Inventor: Lai-Juh Chen, Hsin-chu, Taiwan

[73] Assignee: Industrial Technology Research Institute, Hsinchu, Taiwan

[21] Appl. No.: 581,388

[22] Filed: Dec. 29, 1995

[51] Int. Cl.⁶ .................................................. H01L 21/00
[52] U.S. Cl. ...................... 156/643.1; 156/657.1; 216/38; 437/228
[58] Field of Search ............... 156/636.1, 643.1, 156/657.1, 662.1; 437/228 PL, 238, 195; 216/38, 67

[56] References Cited

U.S. PATENT DOCUMENTS

| | | | |
|---|---|---|---|
| 4,962,063 | 10/1990 | Maydan et al. | 437/228 |
| 5,252,516 | 10/1993 | Nguyen et al. | 437/195 |
| 5,270,234 | 12/1993 | Huang et al. | 437/44 |
| 5,362,686 | 11/1994 | Harada | 437/238 |
| 5,514,624 | 5/1996 | Morozumi | 437/238 X |
| 5,567,661 | 10/1996 | Nishio et al. | 437/238 X |

OTHER PUBLICATIONS

"Improved Sub–Micron Inter–Metal Dielectric Gap–Filling Using TEOS/Ozone APCVD" by E. J. Korczynski et al. Jan. 1992, Microelectronic Manufacturing Technology.

*Primary Examiner*—William Powell
*Attorney, Agent, or Firm*—George O. Saile; Rosemary L. S. Pike

[57] ABSTRACT

An improved method of gap filling in the dielectric layer is described. Semiconductor device structures are formed in and on a semiconductor substrate and the top surface of the substrate is planarized. A conducting layer is deposited over the surface of the substrate and patterned. A layer of TEOS oxide is deposited over the patterned conducting layer by plasma enhanced chemical vapor deposition. While TEOS plasma residual remains on the wafer, the oxide is etched wherein the TEOS plasma protects the surface of the oxide layer. The combination of the TEOS deposition and etching processes results in a gap-filling dielectric.

32 Claims, 8 Drawing Sheets

TEOS PLASMA PROTECTION TECHNOLOGY

BACKGROUND OF THE INVENTION

(1) Field of the Invention

The present invention relates to the fabrication of integrated circuit devices, and more particularly, to a method of improving the gap filling characteristics of the dielectric layer during metallization in the fabrication of integrated circuits.

(2) Description of the Prior Art

Figure 1:
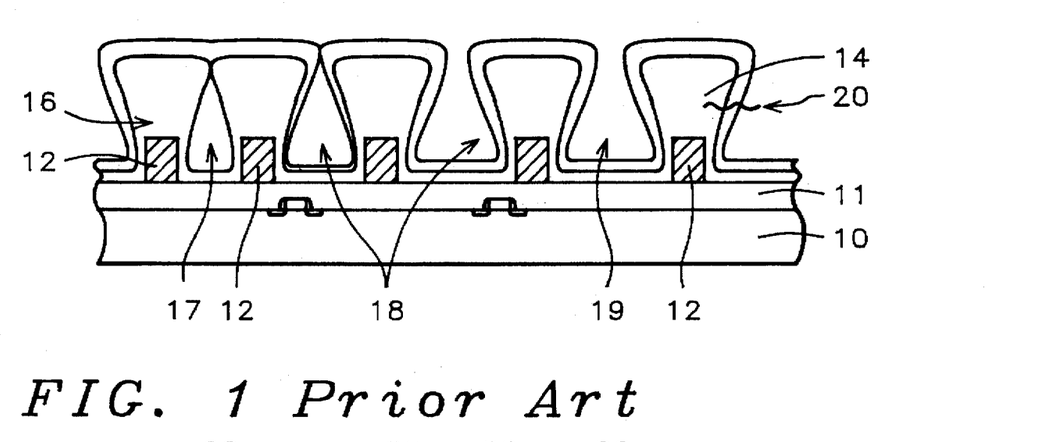
FIG. 1 is a cross-sectional representation of a gap-filling technique of the prior art.

In the fabrication of integrated circuit devices, semiconductor device structures such as gate electrodes and source and drain regions are typically formed in and on a semiconductor substrate. An insulating layer is deposited over the surface of the substrate and planarized. Next, a metal conducting layer is deposited and patterned to contact the underlying semiconductor device structures. A dielectric layer is deposited overlying the metal conducting layer and further conducting layers may be formed. As the packing density of semiconductor devices increases, the size of the gap between the patterned metal areas decreases. FIG. 1 illustrates a partially completed integrated circuit device. Semiconductor substrate 10 which may contain semiconductor device structures and a planarized insulating surface 11 is shown. Metal layer 12 has been deposited and patterned. The gaps between the patterned metal areas are to be filled by dielectric layer 14. The dielectric layer 14 is typically a tetraethoxysilane (TEOS) oxide deposited by chemical vapor deposition (CVD). This deposition technology is subject to arrival angle effect or shadowing effect. That is, the deposition rate of the dielectric material is faster in the corner regions 16 than in other regions. If the oxide thickness is large enough, the corner portions of the dielectric material 14 will meet causing a void 17 to form within the gap. Other problems are thinning of the dielectric layer 18, small cavity 19, and cracking 20. These problems are detrimental to device operation. It is desired to find a gap-filling technique which will completely fill a gap between patterned metal areas without the presence of voids, thinning, or cracking.

Other materials have been used in the art for gap-filling, but there are problems associated with each one. Spin-on-glass material has been used for gap-filling, but it suffers from thermal stability issues, hot carrier effect, and thickness concerns. Sub-atmospheric CVD oxide is surface sensitive, has very low throughput, and is expensive. High density plasma oxide is an unproven process with low throughput. F-doped dielectric suffers from shrinkage effect, moisture adsorption, thermal stability, and hot carrier effect. Therefore, it is desired to find a TEOS gap-filling process which will completely fill a gap between patterned metal areas without the presence of voids, thinning, or cracking.

Conventionally, the dielectric is deposited in a deposition chamber. Then, if etching is desired, the wafer is moved to another tool for etching or is moved to an etching chamber within a cluster tool. It is desired to provide a method to use the same chamber for both deposition and etching.

The paper "Improved Sub-Micron Inter-Metal Dielectric Gap-Filling Using TEOS/Ozone APCVD" by E. J. Korczynski et al, January 1992, *Microelectronic Manufacturing Technology* teaches improved gap-filling using TEOS/Ozone. U.S. Pat. No. 5,362,686 to Harada teaches using a silicon-oxynitride film for superior step coverage. U.S. Pat. No. 5,270,234 to Huang et al teaches selective etching to provide a controlled gap size. U.S. Pat. No. 5,252,516 to Nguyen et al discloses using an ECR plasma to planarize followed by a glasseous material flowed as it is deposited. Co-pending U.S. patent application Ser. No. 08/450,410 (ERSO-83-0059), filed on May 25, 1995, U.S. Pat. No. 5,489,553 to the same inventor discloses an improved gap-filling technique using a HF vapor surface treatment.

SUMMARY OF THE INVENTION

Accordingly, it is a primary object of the present invention to provide a process for improving the gap filling characteristics of the dielectric layer in the fabrication of integrated circuits.

It is a further object of the invention to provide a process for improving the deep sub-micron gap-filling characteristics of the dielectric layer.

Yet another object is to provide a gap-filling process for 0.5 micron metal spacing and less.

Yet another object of the invention is to provide a controllable high temperature plasma etching process for the dielectric layer.

A still further object of the invention is to provide a method for depositing and etching a dielectric layer within the same deposition chamber.

In accordance with the objects of the invention, an improved method of gap filling in the dielectric layer is achieved. Semiconductor device structures are formed in and on a semiconductor substrate and the top surface of the substrate is planarized. A conducting layer is deposited over the surface of the substrate and patterned. A layer of TEOS oxide is deposited over the patterned conducting layer by plasma enhanced chemical vapor deposition. While TEOS plasma residual remains on the wafer, the oxide is etched wherein the TEOS plasma protects the surface of the oxide layer. The combination of the TEOS deposition and etching processes results in a gap-filling dielectric.

BRIEF DESCRIPTION OF THE DRAWINGS

In the accompanying drawings forming a material part of this description, there is shown.

DESCRIPTION OF THE PREFERRED EMBODIMENTS

Figure 2:
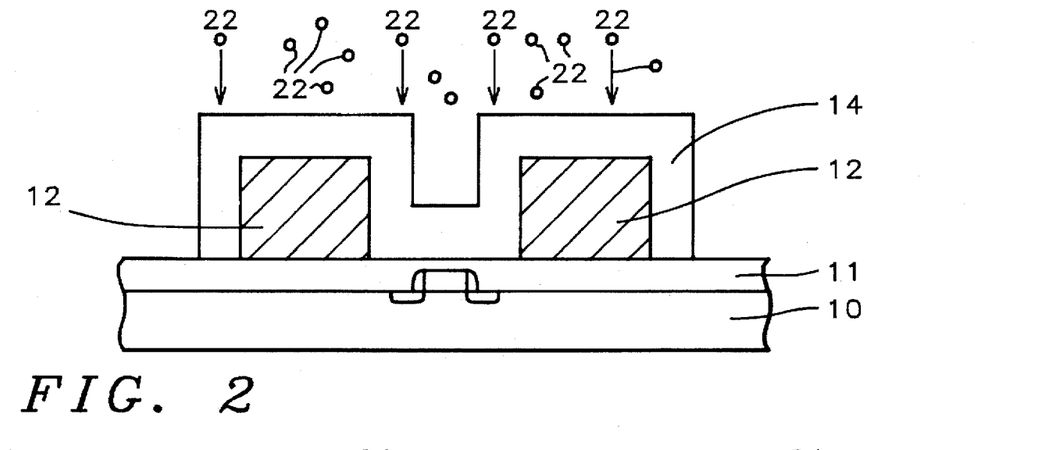
FIGS. 2 and 3 are cross-sectional representations of a high temperature experimental etching process.
Figure 3:
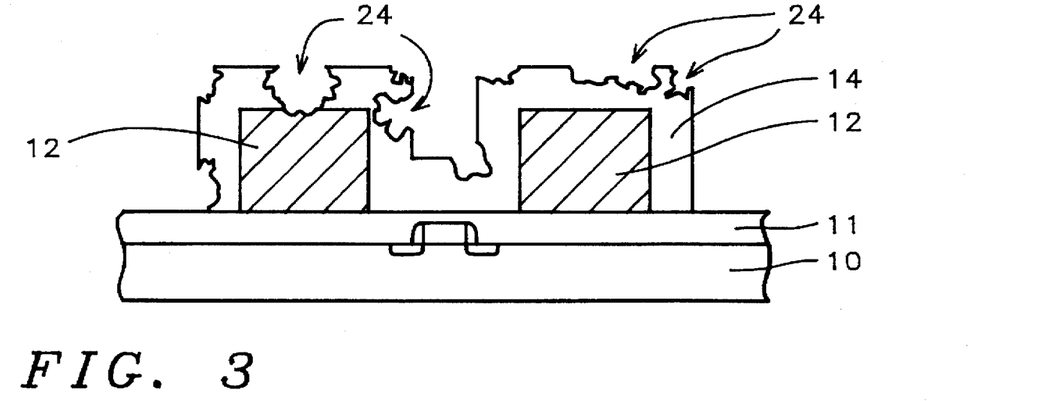

In developing the process of the present invention, experiments were performed using the same deposition chamber for deposition and etching. These experiments will be described with reference to FIGS. 2 and 3. Referring now more particularly to FIG. 2, there is shown a semiconductor substrate 10. A layer of conducting material 12 was deposited over the planarized surface of the semiconductor substrate and patterned. The conducting material may be a metal such as Aluminum, AlCu, AlSiCu, or Cu.

The dielectric layer 14 is TEOS oxide deposited by plasma enhanced chemical vapor deposition (PECVD) at between about 250° to 400° C. After the metal pattern was covered with the dielectric layer 14, as shown in FIG. 2, the deposition chamber was pumped down to remove the deposition gases. The wafer remained in the chamber and the etching process was begun. $C_2F_6$ plasma 22 was used to etch the TEOS layer 14. The etching took place at a high temperature of between about 250° to 400° C., which is the deposition temperature. The high temperature plasma etching process resulted in an uncontrollable etching rate and uncontrollable uniformity, as shown by 24 in FIG. 3.

It takes time to lower the temperature of the deposition chamber for etching. Alternatively, the wafer could be moved to another tool, but at increased cost and time. It is desired to etch the dielectric layer controllably at a high temperature. Further experiments proved the effectiveness of the surprising TEOS plasma protection technique of the present invention, which is described with reference to FIGS. 4 through 7.

Figure 4:
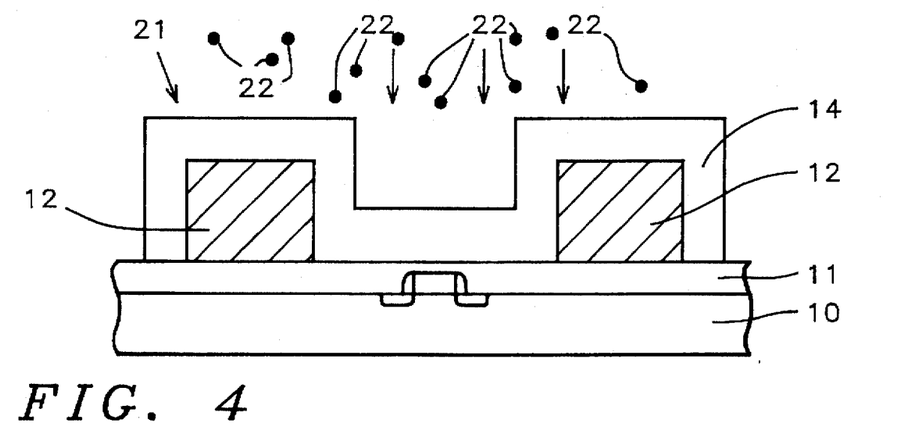
FIGS. 4 through 6, 7A, 7B, 7C, and 7D are cross-sectional representations of a preferred embodiment of the present invention.

Referring now more particularly to FIG. 4, there is shown a semiconductor substrate 10, in which may be formed semiconductor device structures which may include polysilicon gate electrodes and source and drain regions. A planarizing layer 11 is deposited over the surface of the semiconductor device structures. A layer of conducting material 12 has been deposited over the planarized surface of the semiconductor substrate and patterned. The conducting material may be a metal such as Aluminum, AlCu, AlSiCu, or Cu.

A layer of tetraethoxysilane (TEOS) oxide 14 is deposited by plasma enhanced chemical vapor deposition (PECVD) over the surface of the patterned conducting layer by flowing $O_2$ at a rate of between about 200 to 800 sccm and TEOS at a rate of between about 400 to 1000 sccm at a temperature of between about 250° to 400° C., power of between about 600 to 850 watts, and pressure of between about 6 to 9 Torr.

The key feature of the present invention is to begin the etching immediately following the TEOS deposition. No pump down is done. The $C_2F_6$ etchant 22 is fed into the deposition chamber after the TEOS plasma has stopped flowing, but while residual TEOS plasma remains upon the wafer.

The temperature, pressure, and power remain the same during the etching time as during deposition. The surprising result of this technique is a high temperature plasma etching process with controllable etching rate and uniformity. It was thought in the prior art that it was necessary to cool down the substrate between deposition and etching, but this has been found to be unnecessary.

Figure 5:
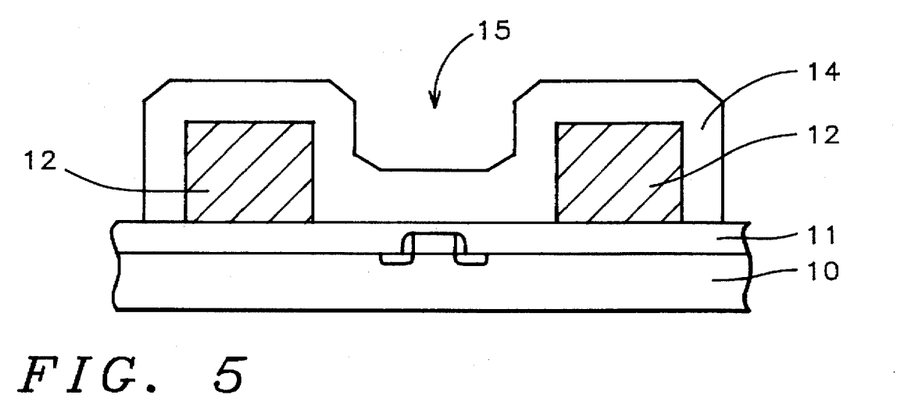
Figure 6:
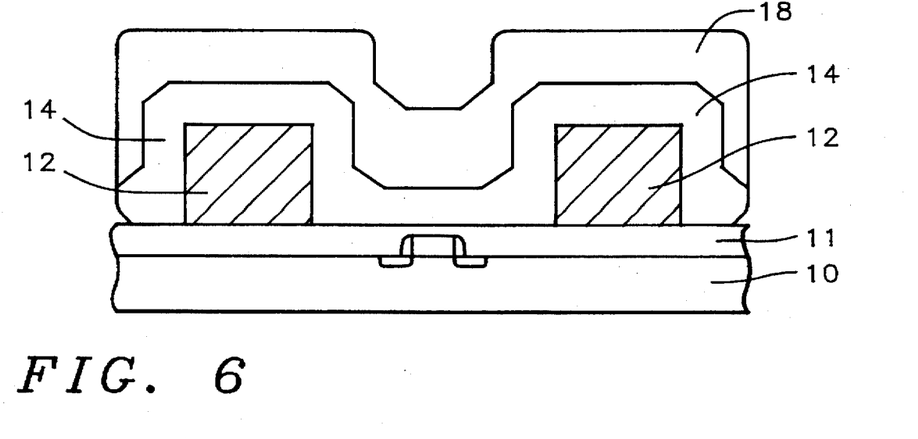

FIG. 5 illustrates the open trench 15 resulting from the etching process. This trench makes subsequent deposition easy. A secondary TEOS PECVD deposition 18 is performed immediately following the etching within the same deposition chamber and under the same conditions resulting in high bottom step coverage and high sidewall step coverage, as illustrated in FIG. 6.

The deposition and etching cycles can be continued as desired to provide the desired thickness of the dielectric layer, which is a function of the metal thickness or spacing.

In experiments, the etchant used was $C_2F_6$, but it is expected that other etchants would work in the same way, such as $NF_3$, $CF_4$, and the like.

Figure 7A:
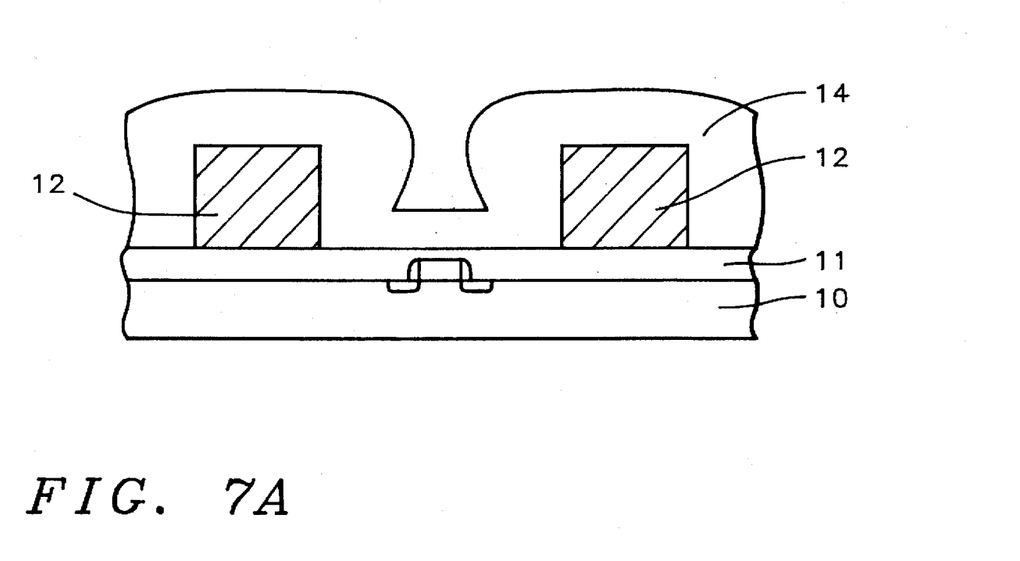
Figure 7B:
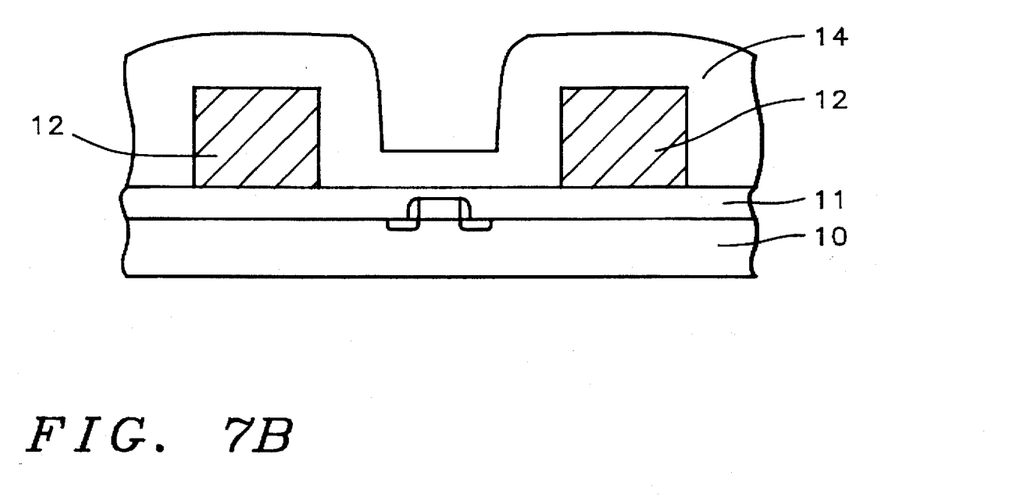
Figure 7C:
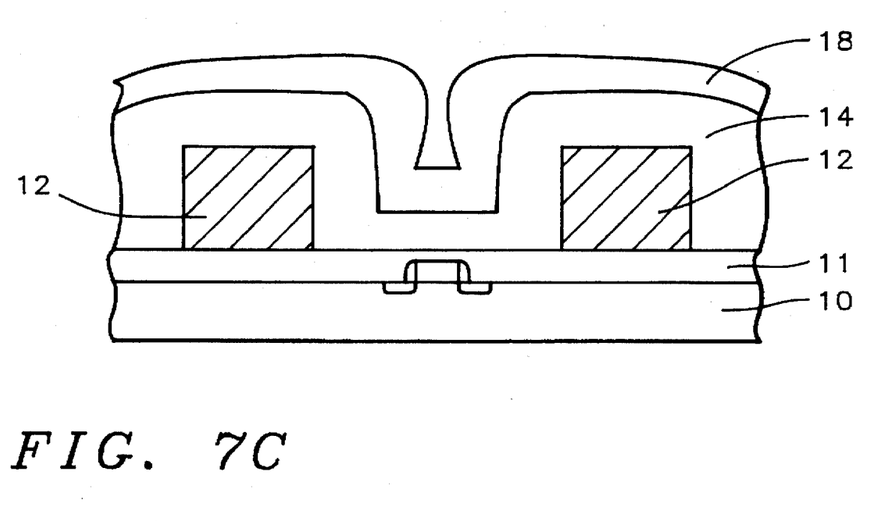
Figure 7D:
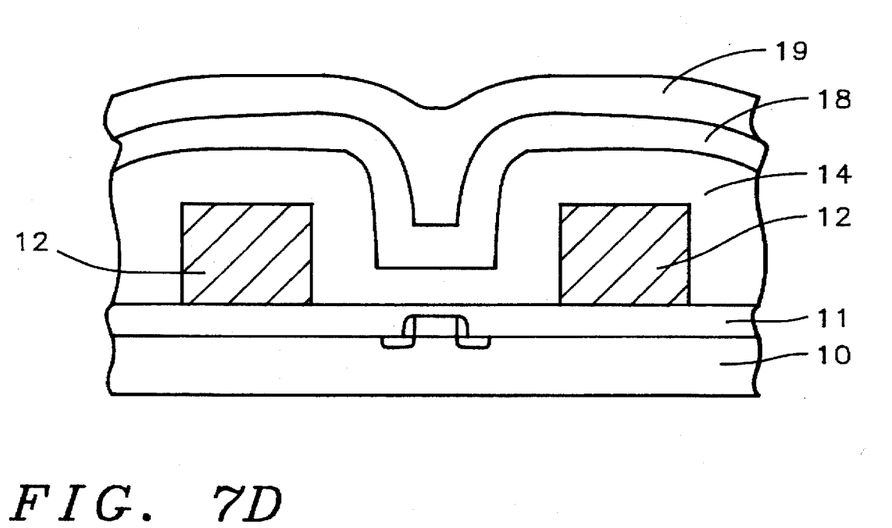

FIGS. 7A through 7D illustrate the deposition and etching cycles. Dielectric oxide layer 14 is deposited in FIG. 7A. The layer is etched in FIG. 7B to open up a trench. In FIG. 7C, dielectric layer 18 is deposited and etched in FIG. 7D. This is repeated as many times as necessary to achieve the desired dielectric thickness.

Figure 8:
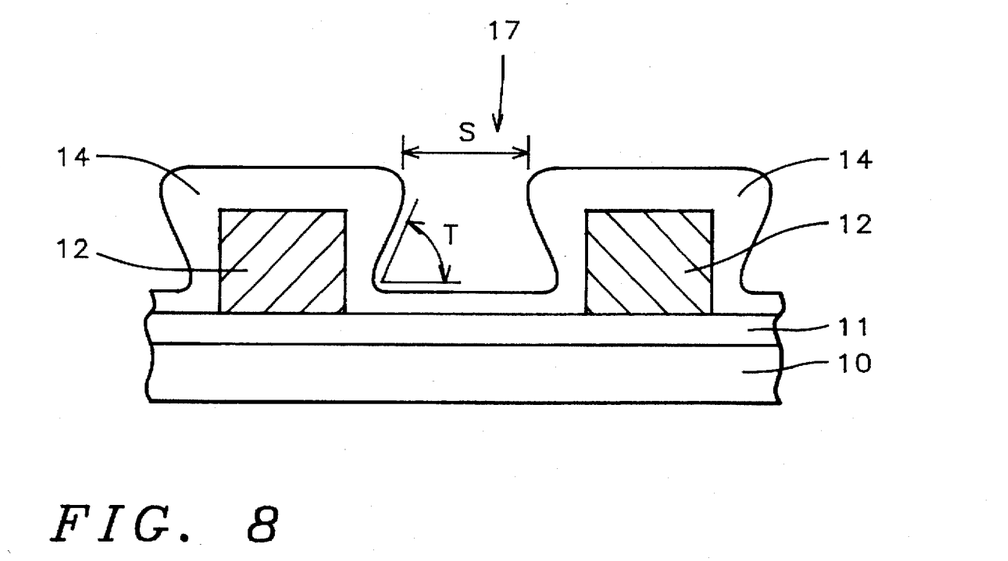
FIG. 8 is a cross-sectional representation of a deposition process.
Figure 9:
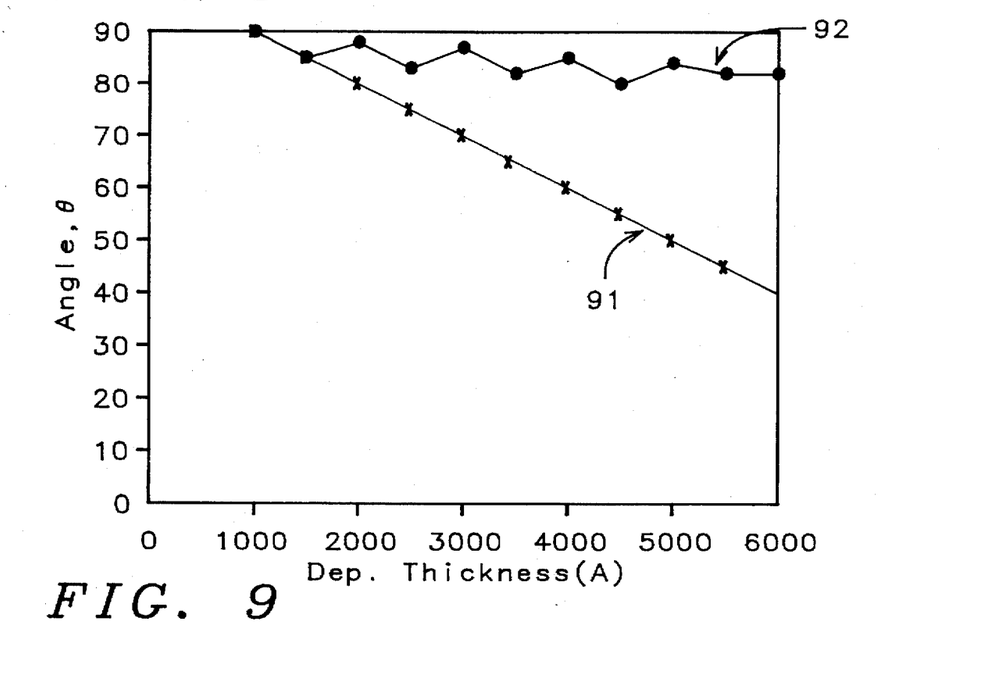
FIG. 9 is a graphical representation of depth of dielectric material versus arrival angle.

FIG. 8 illustrates an arbitrary point within the deposition/ etching process of the invention. Gap 17 is to be filled by the dielectric oxide. The angle T and spacing S, which change during the process of the invention, are illustrated. FIG. 9 graphically illustrates the deposition thickness of the dielectric layer versus the angle T, shown in FIG. 8. Line 91 is the deposition thickness of the conventional PECVD TEOS process at various angles. Line 92 is the deposition thickness of the TEOS plasma protection process of the present invention at various angles. It can be seen that the deposition thickness is relatively independent of the angle for the process of the invention. This is because the oxide is deposited, etched, then deposited again, as shown in FIGS. 7A through 7D.

Figure 10:
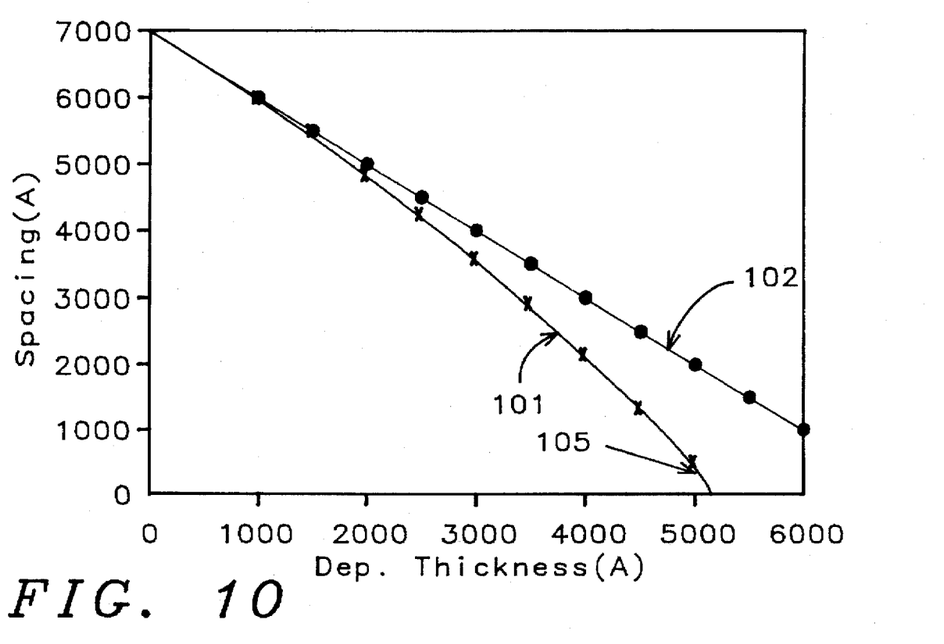
FIG. 10 is a graphical representation of depth of dielectric material versus gap spacing.

FIG. 10 graphically illustrates the deposition thickness of the dielectric layer 18 versus the spacing S, shown in FIG. 8. Line 101 is the deposition thickness of the conventional PECVD TEOS process at various spacings. Line 102 is the deposition thickness of the TEOS plasma protection process of the present invention at various spacings. It can be seen that in the conventional process a void is formed (105) when the deposition thickness is about 5000 Angstroms (that is, the spacing at 105 is 0). However, in the process of the invention, the spacing still has a value of 1000 Angstroms when the dielectric thickness is 6000 Angstroms.

Figure 11:
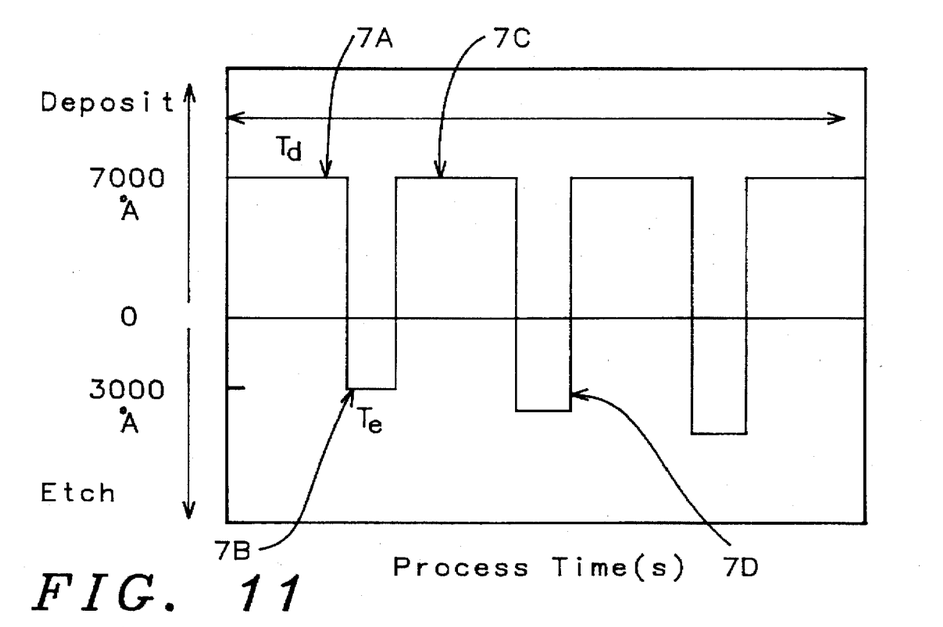
FIG. 11 is a graphical representation of the sequential deposition/etching process of the present invention.

FIG. 11 graphically illustrates the deposition/etch rate of the TEOS plasma protection process of the invention over time. The gap filling capability of the process is a function of the thickness of the deposition, the thickness of the etching, the number of depositions, the number of etchings, and the etch rate. For example, FIGS. 7A through 7D illustrate the first two deposition and etching steps in FIG. 11. The process continues to cycle until the gap is filled.

The present invention uses TEOS plasma deposition and in-situ $C_2F_6$ etching, repeating the deposition and etching process until the needed bottom or sidewall step coverage is achieved. The process of the invention results in a controllable etch rate and uniformity. The process is suitable for chemical mechanical polishing (CMP) planarization and is applicable for the inter-metal dielectric at any level and for top level passivation.

Figure 12:
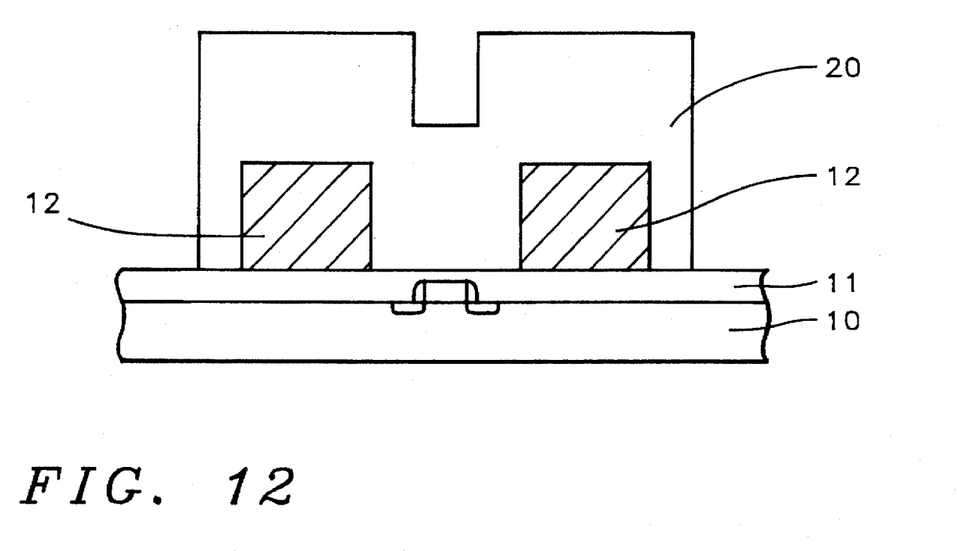
FIG. 12 is a cross-sectional representation of the gap-filling process of the present invention.
Figure 13A:
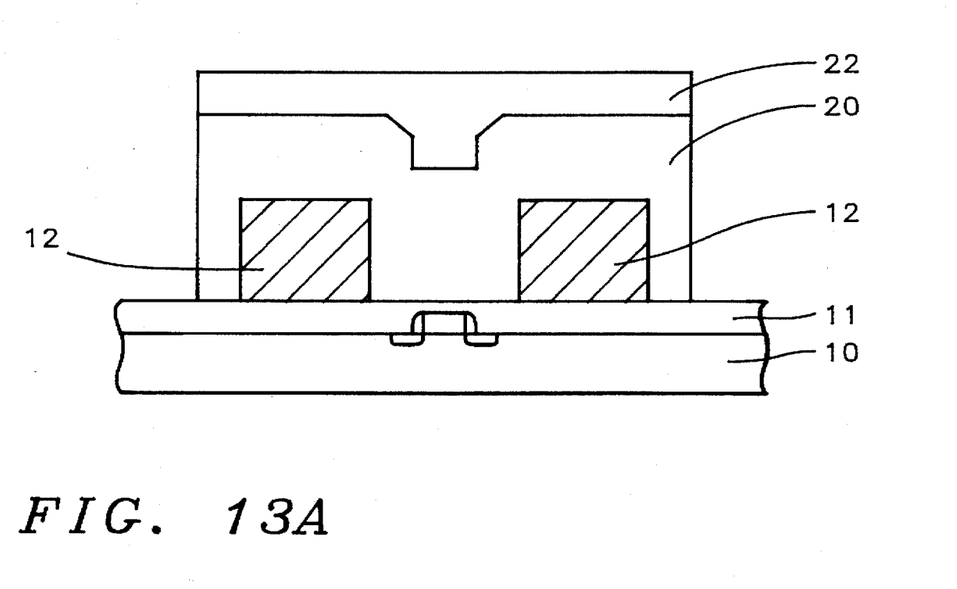
FIGS. 13A and 13B are cross-sectional representations of two alternative planarizing methods of the present invention.
Figure 13B:
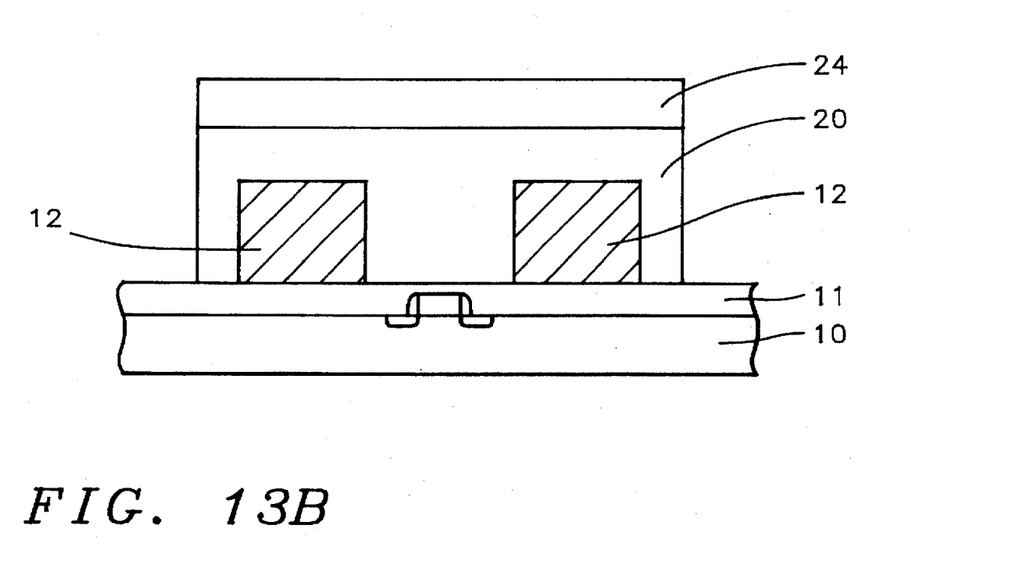

Referring now to FIG. 12, there is shown the integrated circuit device of FIG. 6 after the desired bottom and sidewall thickness of the dielectric layer 20 has been reached. FIGS. 13A and 13B illustrate two possible planarization processes. FIG. 13A illustrates a combined spin-on-glass/etchback process for local smooth planarization. Spin-on-glass layer or layers 22 are coated, baked and cured as is conventional, then etched back for a smooth planarization, resulting in FIG. 13B.

FIG. 13B also illustrates the results of a combined chemical mechanical polishing process for global planarization.

After planarization, a silicon nitride layer 24 is deposited, typically to about 7000 Angstroms thick. This layer serves to protect against moisture attack and mobile ions.

The process of the invention will completely fill a gap between patterned metal areas without the presence of voids, thinning, or cracking. A metal spacing of 0.7 microns has been filled successfully in experimentation and it is expected that a metal spacing of 0.5 microns also would be successfully filled by the inventive process.

The inventive process has high throughput and low cost. The dielectric layer has thermal stability without cracking, high reliability, and moisture protection. The process of the invention can be used for any level of metallization.

Figure 14:
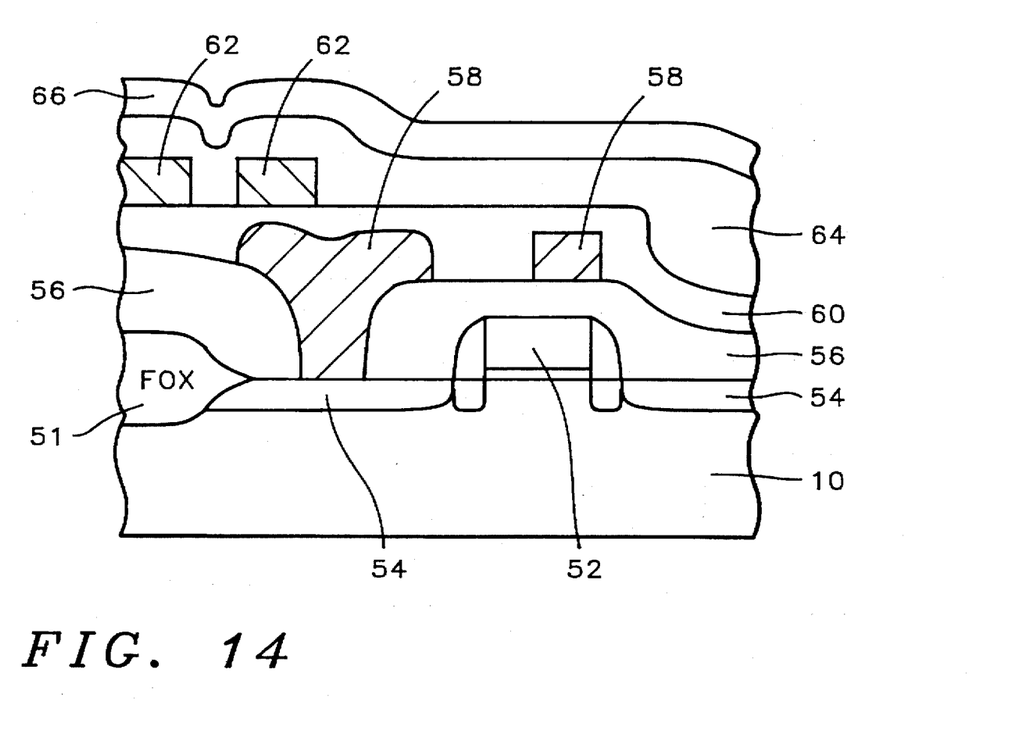
FIG. 14 is a cross-sectional representation of a completed integrated circuit device fabricated according to the process of the invention.

FIG. 14 illustrates a completed integrated circuit device fabricated by the process of the invention. Semiconductor device structures including gate electrode 52 and source and drain regions 54 have been formed in and on the semiconductor substrate 10. An opening has been made through insulating layer 56 to an underlying source/drain region 54. Conducting layer 58 has been deposited and patterned. The process of the invention has been used to deposit and planarize the TEOS oxide layer 60 overlying the patterned conducting layer 58.

A second layer of metallization is deposited and patterned to leave metal lines 62. TEOS oxide layer 64 is deposited and planarized according to the process of the invention. Passivation silicon nitride layer 66 completes the integrated circuit device.

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit device comprising:
    providing a planarized insulating layer over semiconductor device structures in and on a semiconductor substrate;
    depositing a conducting layer overlying said insulating layer and patterning said conducting layer wherein a gap is formed between portions of said patterned conducting layer;
    depositing a TEOS oxide layer over the surfaces of said patterned conducting layer;
    etching said TEOS oxide layer to open a trench within said TEOS oxide layer over said gap wherein residual TEOS plasma protects the surface of said TEOS oxide from uncontrollable etching; and
    wherein said gap is filled by said TEOS oxide layer completing the fabrication of said integrated circuit device.

2. The method according to claim 1 wherein said gap between said portions of said patterned conducting layer is less than about 0.5 microns.

3. The method according to claim 1 wherein said gap is between about 3500 to 8000 Angstroms wide.

4. The method according to claim 1 wherein said TEOS oxide layer is deposited by plasma enhanced chemical vapor deposition at a temperature of between about 250° to 450° C., a TEOS flow rate of between about 400 to 800 sccm, an O$_2$ flow rate of between about 400 to 800 sccm, and pressure of between about 6 to 9 Torr.

5. The method according to claim 1 wherein said depositing said TEOS oxide layer is performed within a deposition chamber and wherein said etching is performed within said same deposition chamber.

6. The method according to claim 5 wherein said deposition chamber is not pumped down after said depositing said TEOS oxide layer.

7. The method according to claim 4 wherein said etching is performed at said same temperature as said depositing said TEOS oxide layer.

8. The method according to claim 1 wherein said steps of depositing said TEOS oxide and etching are repeated until said gap is filled.

9. The method according to claim 1 further comprising planarizing said TEOS oxide layer by chemical mechanical polishing.

10. The method according to claim 1 further comprising planarizing said TEOS oxide layer by the steps of:
    coating said TEOS oxide layer with at least one spin-on-glass layer;
    baking and curing said at least one spin-on-glass layer; and
    etching back said spin-on-glass layer until the surface of said substrate is planarized.

11. A method of forming a gap-filling dielectric layer in the fabrication of an integrated circuit device comprising:
    providing a conducting layer overlying an insulating layer over a semiconductor substrate and patterning said conducting layer wherein a gap is formed between portions of said patterned conducting layer; and
    forming a gap-filling dielectric layer comprising:
        depositing a TEOS oxide layer over the surfaces of said patterned conducting layer;
        etching said TEOS oxide layer to open a trench within said TEOS oxide layer over said gap wherein residual TEOS plasma protects the surface of said TEOS oxide from uncontrollable etching; and
        repeating said depositing and said etching steps until said gap is filled by said TEOS oxide layer
    completing the formation of said gap-filling dielectric layer in the fabrication of said integrated circuit device.

12. The method according to claim 11 wherein said gap between said portions of said patterned conducting layer is less than about 0.5 microns.

13. The method according to claim 11 wherein said gap is between about 3500 to 8000 Angstroms wide.

14. The method according to claim 11 wherein said TEOS oxide layer is deposited by plasma enhanced chemical vapor deposition at a temperature of between about 250° to 450° C., a TEOS flow rate of between about 400 to 800 sccm, an O$_2$ flow rate of between about 400 to 800 sccm, and pressure of between about 6 to 9 Torr.

15. The method according to claim 11 wherein said depositing said TEOS oxide layer is performed within a deposition chamber and wherein said etching is performed within said same deposition chamber.

16. The method according to claim 15 wherein said deposition chamber is not pumped down after said depositing said TEOS oxide layer.

17. The method according to claim 14 wherein said etching is performed at said same temperature as said depositing said TEOS oxide layer.

18. A method according to claim 11 further comprising planarizing said TEOS oxide layer by chemical mechanical polishing.

19. A method according to claim 11 further comprising planarizing said TEOS oxide layer by the steps of:
    coating said TEOS oxide layer with at least one spin-on-glass layer;
    baking and curing said at least one spin-on-glass layer; and
    etching back said spin-on-glass layer until the surface of said substrate is planarized.

20. The method according to claim 11 wherein said semiconductor substrate includes semiconductor device structures including gate electrodes and source and drain regions.

21. The method according to claim 11 wherein said semiconductor substrate includes semiconductor device structures including gate electrodes and source and drain regions and at least a first level of metallization.

22. The method according to claim 11 wherein said semiconductor substrate includes semiconductor device structures including gate electrodes and source and drain regions and a final level of metallization and further comprising depositing a silicon nitride passivation layer overlying said gap-filling dielectric layer.

23. A method of forming a gap-filling dielectric layer in a single deposition chamber in the fabrication of an integrated circuit device comprising:

providing a conducting layer overlying an insulating layer over a semiconductor substrate and patterning said conducting layer wherein a gap is formed between portions of said patterned conducting layer; and forming a gap-filling dielectric layer comprising:

depositing a TEOS oxide layer over the surfaces of said patterned conducting layer within said deposition chamber wherein a high deposition temperature of between about 250° to 450° C. is maintained;

etching said TEOS oxide layer to open a trench within said TEOS oxide layer over said gap wherein residual TEOS plasma within said deposition chamber protects the surface of said TEOS oxide from uncontrollable etching due to said high temperature; and repeating said depositing and said etching steps until said gap is filled by said TEOS oxide layer completing the formation of said gap-filling dielectric layer in said single deposition chamber in the fabrication of said integrated circuit device.

24. The method according to claim 23 wherein said gap between said portions of said patterned conducting layer is less than about 0.5 microns.

25. The method according to claim 23 wherein said gap is between about 3500 to 8000 Angstroms wide.

26. The method according to claim 23 wherein said TEOS oxide layer is deposited by plasma enhanced chemical vapor deposition with a TEOS flow rate of between about 400 to 800 sccm, an $O_2$ flow rate of between about 400 to 800 sccm, and pressure of between about 6 to 9 Torr.

27. The method according to claim 23 wherein said deposition chamber is not pumped down after said depositing said TEOS oxide layer.

28. A method according to claim 23 further comprising planarizing said TEOS oxide layer by chemical mechanical polishing.

29. A method according to claim 23 further comprising planarizing said TEOS oxide layer by the steps of:

coating said TEOS oxide layer with at least one spin-on-glass layer;

baking and curing said at least one spin-on-glass layer; and etching back said spin-on-glass layer until the surface of said substrate is planarized.

30. The method according to claim 23 wherein said semiconductor substrate includes semiconductor device structures including gate electrodes and source and drain regions.

31. The method according to claim 23 wherein said semiconductor substrate includes semiconductor device structures including gate electrodes and source and drain regions and at least a first level of metallization.

32. The method according to claim 23 wherein said semiconductor substrate includes semiconductor device structures including gate electrodes and source and drain regions and a final level of metallization and further comprising depositing a silicon nitride passivation layer overlying said gap-filling dielectric layer.

* * * * *